(12) United States Patent
Brunner et al.

(10) Patent No.: US 7,436,002 B2
(45) Date of Patent: Oct. 14, 2008

(54) SURFACE-MOUNTABLE RADIATION-EMITTING COMPONENT

(75) Inventors: Herbert Brunner, Regensburg (DE); Klaus Höhn, Forchheim (DE); Harald Jäger, Regensburg (DE); Josef Schmid, Regensburg (DE)

(73) Assignee: Osram GmbH (DE)

( * ) Notice: Subject to any disclaimer, the term of this patent is extended or adjusted under 35 U.S.C. 154(b) by 0 days.

(21) Appl. No.: 10/747,703

(22) Filed: Dec. 29, 2003

(65) Prior Publication Data

US 2004/0188697 A1 Sep. 30, 2004

Related U.S. Application Data

(63) Continuation of application No. PCT/DE02/01514, filed on Apr. 25, 2002.

(30) Foreign Application Priority Data

Jun. 29, 2001 (DE) ................ 101 31 698

(51) Int. Cl.
*H01L 33/00* (2006.01)
*H05K 3/34* (2006.01)

(52) U.S. Cl. ............ 257/99; 257/100; 257/98; 257/E33.057; 257/E33.059; 257/E33.066; 257/666; 257/680; 257/788; 257/103; 257/603

(58) Field of Classification Search ............ 257/99, 257/100, 98, E33.057, E33.059, E33.066, 257/103, 323.057, 788, 680, 603, 666
See application file for complete search history.

(56) References Cited

U.S. PATENT DOCUMENTS

| | | | |
|---|---|---|---|
| 4,872,765 A | 10/1989 | Schodowski | |
| 5,035,483 A | 7/1991 | Waitl et al. | |
| 5,682,066 A | 10/1997 | Gamota et al. | |
| 5,906,459 A | 5/1999 | Thomas et al. | |
| 5,942,770 A | 8/1999 | Ishinaga et al. | |
| 5,981,979 A | 11/1999 | Brunner | |
| 6,051,848 A | 4/2000 | Webb | |
| 6,054,716 A * | 4/2000 | Sonobe et al. | 250/552 |
| 6,066,861 A * | 5/2000 | Hohn et al. | 257/99 |
| 6,274,890 B1 * | 8/2001 | Oshio et al. | 257/98 |
| 6,376,902 B1 * | 4/2002 | Arndt | 257/678 |
| 6,432,745 B1 * | 8/2002 | Waitl et al. | 438/116 |
| 6,472,765 B1 * | 10/2002 | Sano et al. | 257/787 |
| 6,476,930 B1 | 11/2002 | Roberts et al. | |
| 6,555,958 B1 * | 4/2003 | Srivastava et al. | 313/506 |
| 6,576,930 B2 * | 6/2003 | Reeh et al. | 257/98 |
| 6,624,491 B2 * | 9/2003 | Waitl et al. | 257/434 |
| 6,800,373 B2 * | 10/2004 | Gorczyca | 428/447 |
| 6,809,471 B2 * | 10/2004 | Setlur et al. | 313/503 |
| 6,888,864 B1 * | 5/2005 | Kawanishi et al. | 372/43.01 |
| 6,900,511 B2 * | 5/2005 | Ruhnau et al. | 257/432 |
| 6,906,459 B2 * | 6/2005 | Suehiro et al. | 313/512 |

(Continued)

FOREIGN PATENT DOCUMENTS

CN 1207206 7/1986

(Continued)

*Primary Examiner*—Alexander O Williams
(74) *Attorney, Agent, or Firm*—Fish & Richardson P.C.

(57) ABSTRACT

A radiation-emitting surface-mountable component has a light-emitting diode chip mounted on a leadframe. A molding material encapsulates the leadframe and the light-emitting diode chip.

41 Claims, 2 Drawing Sheets

U.S. PATENT DOCUMENTS

| | | |
|---|---|---|
| 2002/0028527 A1* | 3/2002 | Maeda et al. ............... 438/29 |
| 2002/0072137 A1* | 6/2002 | Ih ............................... 438/22 |
| 2002/0097579 A1* | 7/2002 | Stalions ..................... 362/241 |
| 2002/0158565 A1* | 10/2002 | Setlur et al. ............... 313/486 |
| 2002/0195935 A1* | 12/2002 | Jager et al. ................ 313/512 |
| 2003/0168670 A1* | 9/2003 | Roberts et al. ............. 257/98 |
| 2003/0168720 A1* | 9/2003 | Kamada ..................... 257/666 |
| 2004/0026709 A1* | 2/2004 | Bader et al. ................ 257/103 |
| 2004/0046242 A1* | 3/2004 | Asakawa .................... 257/678 |
| 2004/0075100 A1* | 4/2004 | Bogner et al. .............. 257/99 |
| 2004/0084681 A1* | 5/2004 | Roberts ...................... 257/79 |
| 2004/0094757 A1* | 5/2004 | Braune et al. .............. 257/13 |
| 2004/0124758 A1* | 7/2004 | Danielson et al. .......... 313/486 |
| 2004/0257797 A1* | 12/2004 | Suehiro et al. ............. 362/34 |
| 2005/0133810 A1* | 6/2005 | Roberts et al. ............. 257/99 |
| 2005/0162069 A1* | 7/2005 | Ota et al. ................... 313/501 |
| 2005/0245018 A1* | 11/2005 | Bogner et al. .............. 438/200 |

FOREIGN PATENT DOCUMENTS

| | | |
|---|---|---|
| DE | 19963806 A1 | 6/1971 |
| DE | 38 04 293 A1 | 8/1989 |
| DE | 3804293 | 8/1989 |
| DE | 19638667 A1 | 2/1996 |
| DE | 196 38 667 A1 | 4/1998 |
| DE | 19649650 A1 | 4/1998 |
| DE | 196 49 650 A1 | 6/1998 |
| DE | 199 63 806 A1 | 7/2001 |
| EP | 0400175 | 5/1990 |
| EP | 0 400 175 A1 | 12/1990 |
| EP | 0 646 971 A2 | 4/1995 |
| EP | 0646971 | 5/1995 |
| EP | 09933823 | 4/1998 |
| EP | 09933823 A2 * | 8/1999 |
| JP | 57169281 | 10/1982 |
| JP | 3-22486 | 1/1991 |
| JP | 3270083 A | 2/1991 |
| JP | 3-270083 A | 12/1991 |
| JP | 06065473 | 3/1994 |
| JP | 06204569 | 7/1994 |
| JP | 07169893 | 7/1995 |
| JP | 08176407 A | 9/1996 |
| JP | 10290029 | 10/1998 |
| JP | 11346005 A | 12/1999 |
| JP | 11346008 A | 12/1999 |
| JP | 2000077720 A | 3/2000 |
| TW | 311269 | 3/1996 |
| TW | 311269 | 7/1997 |
| WO | 97/50132 | 12/1997 |
| WO | 98/12757 | 3/1998 |
| WO | 98/54929 | 12/1998 |
| WO | 01/50540 | 7/2001 |
| WO | 01/50540 A1 | 7/2001 |

* cited by examiner

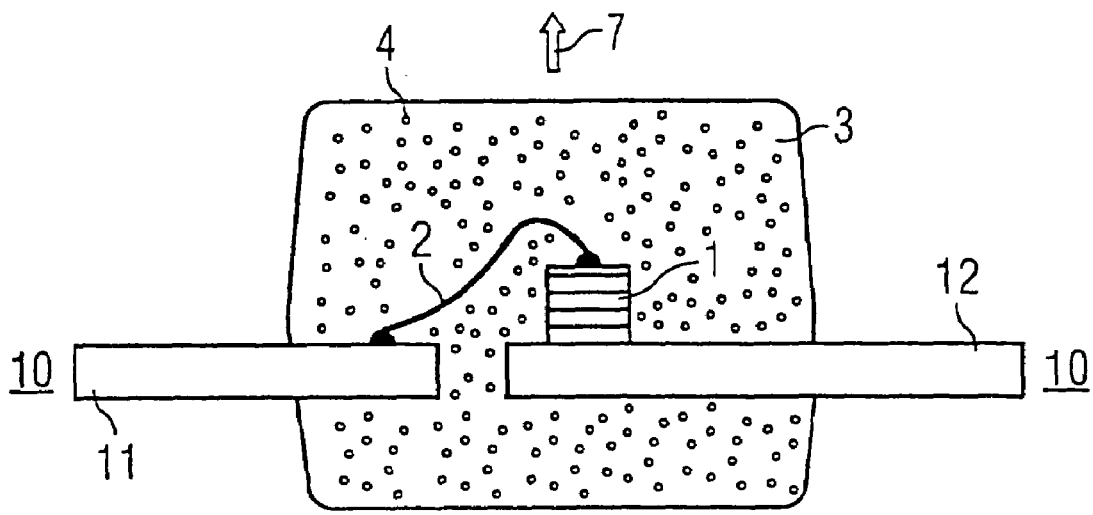
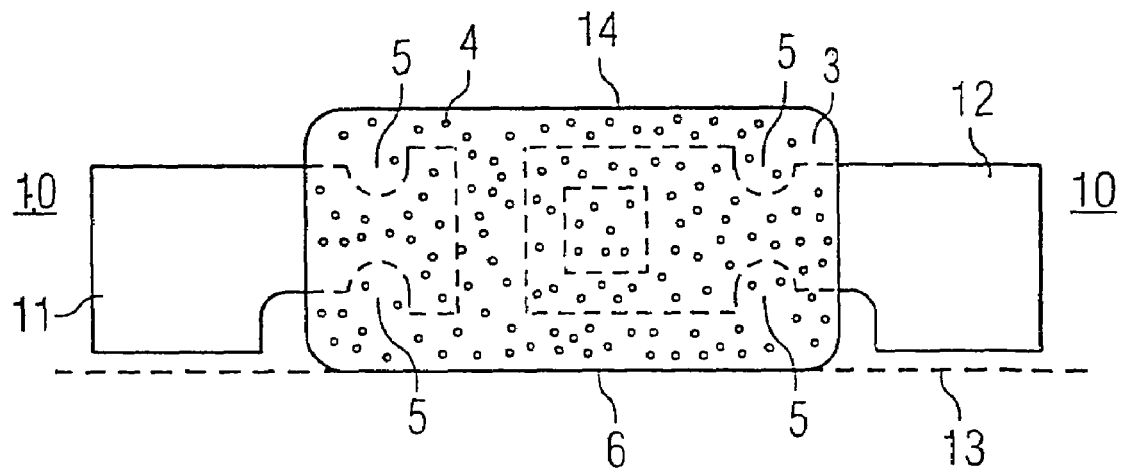

SURFACE-MOUNTABLE RADIATION-EMITTING COMPONENT

CROSS-REFERENCE TO RELATED APPLICATION

This application is a continuation of copending International Application No. PCT/DE02/01514, filed Apr. 25, 2002, which designated the United States. The international application claims the benefit of priority under 35 U.S.C. § 119 of German patent application DE 101 31 698.4 filed Jun. 29, 2001, which is herewith incorporated in its entirety.

BACKGROUND OF THE INVENTION

Field of the Invention

The invention relates to a surface-mountable radiation-emitting component and a process for its production. German published patent application DE 38 04 293 discloses a white light source based on a semiconductor LED. Described therein is a configuration which has electroluminescence or a laser diode and wherein the emission spectrum emitted by the diode is shifted toward greater wavelengths by means of a plastics element to which a phosphorescent, light-converting organic dye has been added. The light emitted by the configuration thus has a color differing from that of the light emitted by the light-emitting diode. Depending on the type of dye added in the plastic, light-emitting diode configurations which luminesce in different colors can be produced using one and the same light-emitting diode type.

WO 98/12757 describes a wavelength-converting potting compound for an electroluminescent component having a body which emits ultraviolet, blue or green light and is based on a transparent epoxy resin and to which a phosphor, in particular an inorganic luminescent pigment powder comprising luminescent pigments from the group consisting of the phosphors, has been added. A preferred embodiment described is a white light source wherein a radiation-emitting semiconductor LED based on GaAlN, having an emission maximum between 420 nm and 460 nm, is used together with a phosphor which is chosen so that a blue radiation emitted by the semiconductor body is converted into complementary wavelength ranges, in particular blue and yellow, or into additive color triplets, e.g. blue, green and red. Here, the yellow or the green and the red light is produced by the phosphors. The hue (hue in the CIE color table) of white light produced in this manner can be varied by a suitable choice of the phosphor or phosphors with regard to mixing and concentration.

Similarly, published international application WO 98/54929 discloses a semiconductor element emitting visible light and having a UV/blue LED which is arranged in a depression in a support body whose surface has a light-reflecting layer and is filled with a transparent material which surrounds the LED on its light exit sides. For improving the light output, the transparent material has a refractive index which is lower than the refractive index of the optically active region of the LED.

In these prior art designs, a pre-housed component is first produced by surrounding a prefabricated leadframe with a suitable plastics material by injection molding. The plastics material forms the housing of the component. The component has, at the top, a depression into which leadframe connections are introduced from two opposite sides, onto one of which connections a semiconductor LED is adhesively bonded and electrically contacted. A potting compound to which the phosphor has been added, as a rule a transparent epoxy resin, is then introduced into this depression.

The advantage of the prior designs is that very directed emission can be achieved by virtue of the fact that the side walls formed by the plastics housing can be in the form of inclined reflectors. In the applications wherein, however, such directed emission is not absolutely essential or is achievable in another way, the production process is relatively complicated and multistage, since the housing plastic and potting compound are formed from two different materials and have to be shaped in separate process steps. In addition, the problem of sufficient and thermally stable adhesion between the potting compound and the housing plastic always has to be solved. In practice, this constantly leads to problems, particularly with the use of high light powers.

In many potential applications for light-emitting diodes, such as, for example, in display elements in the automobile dashboard area, lighting in aircraft and automobiles and in full-color LED displays, there is increasingly a need for light-emitting diode configurations by means of which multicolored light, in particular white light, can be produced. As large an area of the color space as possible should be covered with regard to the color of the light produced. There is often a need for lighting and display elements which emit light having an exactly predetermined color location and an exactly predetermined color saturation.

SUMMARY OF THE INVENTION

It is accordingly an object of the invention to provide a surface-mountable radiation emitter component and a corresponding production method which overcome the above-mentioned disadvantages of the heretofore-known devices and methods of this general type.

With the foregoing and other objects in view there is provided, in accordance with the invention, a surface-mountable radiation-emitting component with a commonly encased leadframe and a radiation-emitting chip. The component comprises:

a leadframe and a radiation-emitting chip mounted on the leadframe;

a molding material encasing the leadframe and the radiation-emitting chip and having a shape defining a mounting surface of the component, the mounting surface extending at a first predetermined angle relative to a main emission direction of the component;

the leadframe having leadframe connections protruding out of the molding material and having connection surfaces enclosing a second predetermined angle with the mounting surface.

With the above and other objects in view there is also provided, in accordance with the invention, a method for producing a surface-mountable, radiation-emitting component, the method which comprises the following steps:

mounting a radiation-emitting chip on a leadframe;

preparing a molding material from a resin powder prereacted with curing agent, and optionally added further fillers; and encasing the leadframe and the radiation-emitting chip with the molding material.

Accordingly, the invention describes a surface-mountable radiation-emitting component having a radiation-emitting chip which is mounted on a leadframe, the leadframe and the radiation-emitting chip being surrounded by a molding material which is shaped in such a way that the component has a mounting surface which is arranged at a first predetermined angle relative to a main emission direction of the component.

The leadframe has leadframe connections which lead out from the molding material and have connection surfaces which are arranged at a second predetermined angle relative to the mounting surface.

The radiation-emitting chip may be a light-emitting diode chip such as, for example, a semiconductor LED or a semiconductor laser. Preferably, this chip emits electromagnetic radiation in the ultraviolet or blue spectral range.

In a preferred embodiment of the invention, the main emission direction and the mounting surface are arranged parallel so that the first angle is 0°. The component is in the form of a so-called lateral emitter which emits predominantly parallel to the mounting surface or, in the installed state, to a support plate, for example a circuit board, on which the component is fastened. Such an emission characteristic is advantageous, particularly for lateral light input into a display to be illuminated, for example an LCD display, and permits a very flat design. The leadframe is preferably arranged so that the connection surfaces of the leadframe connections are perpendicular to the mounting surface or are arranged at approximately a right angle to the mounting surface, so that the second predetermined angle is 90° or, for example, is between 70° and 90°. Furthermore, the first predetermined angle may also be, for example, between 0° and 20°, so that the component emits laterally without the main emission direction being oriented parallel to the mounting surface.

Alternatively, the main emission direction may also be arranged perpendicular to the mounting surface so that the first predetermined angle is 90°. A similar configuration having a first predetermined angle between 70° and 90° is likewise possible. In this case, a parallel or approximately parallel configuration of the connection surfaces of the leadframe relative to the mounting surfaces with a second predetermined angle between 0° and 20° is advantageous. Said angle ranges do not of course restrict the invention.

A further advantage of a component which has a radiation-emitting chip mounted on a leadframe and is surrounded by a molding material is a very compact design and very little space requirement of the component in combination with good heat removal. Very tightly packed modules with a multiplicity of such components can thus be realized with such components.

The molding material is preferably resin-based, in particular formed from a prereacted resin. The molding material is particularly preferably prepared by mixing and blending a radiation-permeable plastics compression molding material with a conversion material.

In a preferred embodiment, the leadframe connections led out laterally extend up to the mounting plane determined by the mounting surface or to the vicinity thereof. This ensures that a support plate having corresponding conductor track structures can simultaneously serve for electric supply to the component. The leadframe connections may also end a slight distance away from the mounting plane. Contact points produced on the support plate, for example solder contact surfaces, are as a rule slightly dome-shaped and thus compensate the distance between the leadframe connections and a support plate.

Preferably, the leadframe as a whole is flat. This simplifies the production since no additional bends have to be made. In addition, mechanical stresses which might occur as a result of such bends are avoided. Furthermore, a flat leadframe is a planar, exactly defined mounting platform for mounting the radiation-emitting chip. This facilitates the automatic equipping and contacting with these chips. In particular, the optical recognition and control systems used for this may be confused by non-plane-parallel mounting surfaces, as may occur in prebent leadframes, for example as a result of bending tolerances. This leads to malfunctions, which are reduced in the case of flat leadframes.

Furthermore, it is advantageous to provide passages or lateral recesses in the leadframe. These passages or recesses are filled by the plastics compression molding material, resulting in mechanically stable anchoring of the leadframe in the plastics compression molding material.

In a particularly preferred embodiment, the component has a top surface parallel to the mounting surface. This permits the use of the component in so-called pick & place processes, preferably in combination with automatic equipping apparatuses. The component is sucked on a surface by a suction arm, transported to its intended equipping location and mounted there. This requires as a rule parallel and flat suction and mounting surfaces.

An advantageous further development of the invention comprises shaping the covering in such a way that the component is bounded in the emission direction by a curved surface. The covering thus simultaneously performs the function of an optical element, for example of a lens. Depending on the curvature and direction of curvature, both focusing and extension of the emission characteristic can be achieved.

Depending on the matching of the conversion material with the radiation produced by the radiation-emitting chip, the invention is suitable as a white light source or as a colored light source, it being possible for color location and color saturation to be freely established within wide limits when suitable conversion materials are used. Owing to a certain proportion of white light, the optical impression of an unsaturated emission color may be evoked in the case of a colored light source.

However, the invention is not restricted to the visible optical spectral range. The radiation-emitting chip and/or the conversion element can also be provided for ultraviolet or infrared radiation emission. Thus, for example, mixed-"color" infrared or ultraviolet radiation, i.e. infrared or ultraviolet radiation having two or more spectral components, can be produced.

With regard to shaping, the component advantageously dispenses with the formation of a depression and the use of two different materials and instead envisages the use of a single transparent molding material which is optionally first mixed with the conversion material and then shaped, preferably injection molded, around the leadframe. The cured molding material thus simultaneously serves as a component housing and as a transparent conversion material matrix. Thus, on the one hand, the production process is considerably simplified since the housing is formed in a single shaping process, in particular an injection molding process. At the same time, the molding material may serve as the matrix for the conversion material.

Furthermore, a component is produced which has improved stability properties since the problem of adhesion between two surrounding materials, such as, for example, a basic housing body and an encapsulation, which moreover may have different coefficients of thermal expansion, no longer occurs.

The color locations are established in a reproducible and specific manner within narrow limits by virtue of the fact that the sedimentation of the conversion materials during storage and processing, in particular through rapid curing steps, is very substantially ruled out. The quality of the conversion materials is increased by simple process steps with simpler metering possibilities in the resin preparation, mixing and metering.

The use of only a single material for the housing form and the conversion material matrix results in latitude for further miniaturization. This additional miniaturization potential can be utilized for the use of these components in mobile electronic product systems, for example as a white light source. Increased light yields through greater utilization of the lateral emission in special installation situations with further degrees of freedom of design or straightforward lateral light output possibilities extend the functionality.

The plastics compression molding material, as a starting material, may be a commercially available compression molding material and substantially comprises, for example, an epoxy-cresol novolak or conventional epoxy resin systems with an anhydride or a conventional phenol curing system.

The conversion material dispersed in the plastics compression molding material may be an inorganic luminescent pigment powder which contains phosphors of the general formula $A_3B_5X_{12}$: M. In particular, particles from the group consisting of the Ce-doped garnets may be used as luminescent pigments, Ce-doped yttrium aluminum garnet ($Y_3Al_5O_{12}$:Ce) being mentioned in particular. Further possible phosphors are sulfide- and oxysulfide-based host lattices, aluminates, borates, etc., having metal centers appropriately excitable in the short-wave range. Organometallic phosphor systems may also be used. The luminescent pigments may also contain a plurality of different phosphors and the conversion material may contain a plurality of different luminescent pigments.

The phosphor can also be formed by soluble and sparingly soluble organic dyes and phosphor mixtures.

Furthermore, an adhesion promoter, preferably in liquid form, can be mixed with the preferably predried conversion material in order to improve the adhesion of the conversion material with the plastics compression molding material. Particularly when inorganic luminescent pigments are used, 3-glycidyloxy-propyltrimethoxysilane or further derivatives based on trialkoxysilane can be used as adhesion promoters.

Monofunctional and polyfunctional polar agents having carboxyl, carboxylic ester, ether and alcohol groups, such as, for example, diethylene glycol monomethyl ether, can be used for modifying the phosphor surfaces. This improves the wettability of the high-energy phosphor surfaces and hence the compatibility and dispersing during the processing with the molding material.

Furthermore, a mold release agent or lubricant can be mixed with the plastics compression molding material before the mixing with the conversion material. Such mold release agents facilitate the removal of the cured molding material from the mold. A solid wax-based mold release agent or a metal soap with long-chain carboxylic acids, in particular stearates, can be used as such a mold release agent.

For example, inorganic fillers, by means of which the refractive index of the molding material can be increased, may be admixed as further fillers, with the result that the light yield of the component can be increased. For example, $TiO_2$, $ZrO_2$, $\alpha$-$Al_2O_3$ or another metal oxide may be used as such fillers.

In an advantageous embodiment of the invention, glass particles, so-called glass fillers, are added to the molding material as a filler. The glass transition temperature $T_g$ of the molding material is thus increased. The glass transition temperature of the molding material limits the temperature range permissible for the component since exceeding the glass transition temperature may lead to flow of the molding material and consequently to stresses and defects in the radiation-emitting chip and wire connections attached thereto. The addition of glass particles to the molding material advantageously increases the temperature range permissible for the component. Furthermore, the component can be operated at a higher operating current and more radiation can be produced. A further advantage is a reduction of the coefficient of thermal expansion of the molding material, which coefficient is therefore better adapted to the coefficient of thermal expansion of the leadframe, so that the thermal stability of the component is further increased.

As a result of the addition of glass particles, the refractive index of the molding material is furthermore increased so that the refractive index jump between the radiation-emitting chip and the molding material is smaller and advantageously the radiation output is greater.

Finally, the water absorption of the molding material is reduced by the addition of glass particles. This advantageously leads to an improved thermal load capacity of the component. In particular, the risk of damage to or of bursting of the component during soldering in, owing to an excessively high water content (so-called popcorn effect), is advantageously reduced.

The mean particle size of the glass particles is preferably less than 100 μm, particularly preferably less than 50 μm. Inter alia, the risk of blockage of the often narrow feed channels of an injection mold is thus reduced.

The proportion of glass particles in the molding material may be 90% by weight or more and is preferably between 10% by weight and 50% by weight. In the last-mentioned range, the molding material is distinguished both by high transparency and by a high glass transition temperature.

Preferably, the conversion material and optionally the further fillers are mixed by first mixing them coarsely and then milling the mixture in a mill, with the result that a very fine, homogeneous powder is obtained.

The mixed molding material may therefore contain the following constituents (in % by weight):

a) plastics compression molding material $\geq 60\%$
b) conversion material $>0$ and $\leq 40\%$
c) adhesion promoter $\geq 0$ and $\leq 3\%$
d) mold release agent $\geq 0$ and $\leq 2\%$
e) surface modifier $\geq 0$ and $\leq 5\%$
f) antioxidant $\geq 0$ and $\leq 5\%$ (e.g. based on phosphite or based on sterically hindered phenols)
g) UV light stabilizer $\geq 0$ and $\leq 2\%$
h) glass particles $\geq 0$ and $\leq 80\%$.

Other features which are considered as characteristic for the invention are set forth in the appended claims.

Although the invention is illustrated and described herein as embodied in a surface-mountable radiation-emitting component and process for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic sectional view of a first embodiment of a component according to the invention;

FIG. 2 is a schematic sectional view of a second embodiment of a component according to the invention;

DESCRIPTION OF THE PREFERRED EMBODIMENTS

Figure 3:
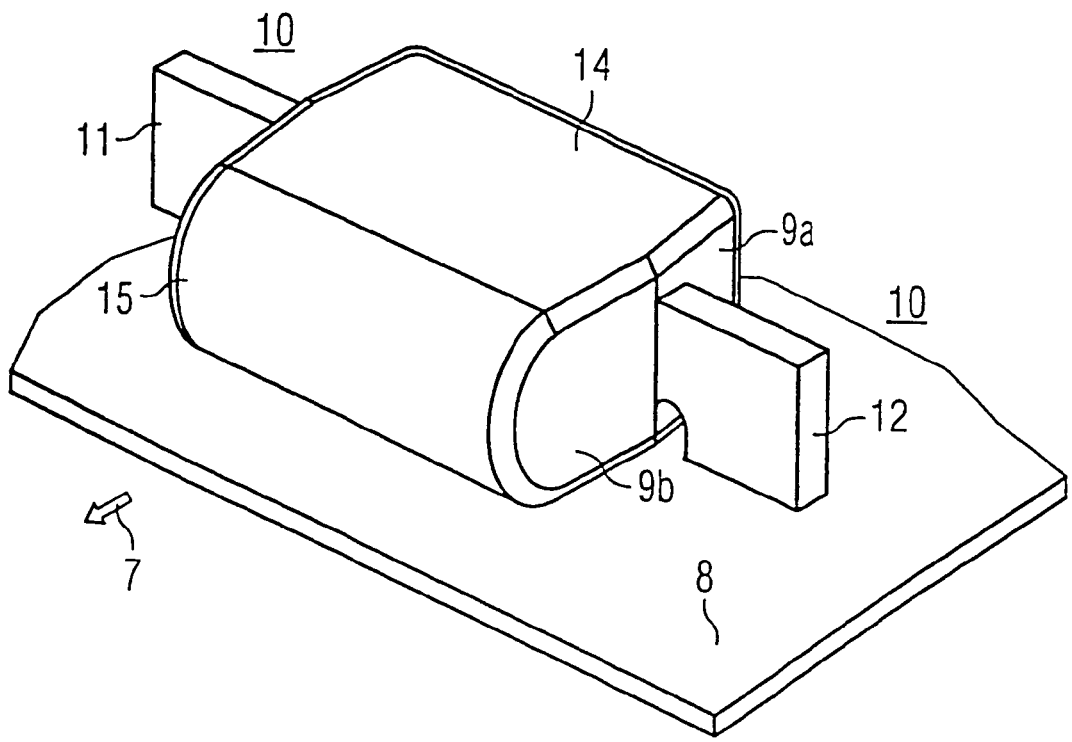
FIG. 3 is a schematic perspective view of a third embodiment of a component according to the invention.

Referring now to the figures of the drawing in detail and first, particularly, to FIG. 1 thereof, there is shown an embodiment of a component according to the invention in a cross section that is taken along a longitudinal axis of a leadframe 10.

In an originally one-piece and cohesive leadframe 10, two leadframe connections 11 and 12 are formed, which are initially held together in a manner known per se by narrow connecting webs but are isolated from one another in the course of the production process by separation of these connecting webs.

On one leadframe connection 12, a completely processed semiconductor LED 1 having an electrically conductive connecting means, such as conductive silver or the like, is adhesively bonded or soldered on the inside end section of the leadframe connection, so that the n-side or p-side of the semiconductor LED 1 is connected to the leadframe terminal 12. The opposite p-conducting or n-conducting contact side is connected by a bond wire 2 to the end section of the other leadframe connection 11.

The component is surrounded by a plastics compression molding material 3, into which a conversion material 4 in the form of phosphor particles can preferably be introduced. This will be explained in more detail below.

In the illustrated component, the mounting surface is parallel to the plane of the section. The leadframe 10 is flat throughout and is approximately perpendicular to the mounting surface so that the second predetermined angle is about 90° within the manufacturing tolerances.

This design permits both economical manufacture of the leadframe, for example by punching out of a metal sheet or of a foil without additional bends, and a very small space requirement of the component. The emission takes place predominantly perpendicular to the leadframe 10, so that a main emission direction 7 is approximately parallel to the mounting surface, and the first predetermined angle is 0° within the manufacturing tolerances.

FIG. 2 shows a schematic sectional view of a further embodiment of a component according to the invention. The plane of the section is once again along a longitudinal axis of the leadframe 10 and is oriented perpendicular to the plane of the section chosen in FIG. 1.

Here, the leadframe 10 has lateral recesses 5. These recesses 5 are filled with the surrounding plastics compression molding material, thus forming a type of toothed system between the leadframe 10 and the covering. This toothed system ensures mechanically stable anchoring of the leadframe in the covering. For this purpose, it would also be possible to form non-illustrated passages in the leadframe 10.

The leadframe connections 11, 12 project, in a main extension direction of the mounting plane 13 determined by the mounting surface 6, out of the covering of the component and extend, a distance away from the covering, in the direction of the mounting plane 13. A small gap which is bridged during contacting, for example by solder contacts, is formed between the mounting plane 13 and the leadframe connections 11, 12. Advantageously, the positioning of the component is thus determined solely by the mounting surface 6, with the result that mechanical stresses between leadframe 10 and covering are avoided. Furthermore, the slight distance of the leadframe connections 11, 12 from the mounting plane 13 reduces the risk that the leadframe connections 11, 12, which project beyond the mounting plane 13, for example owing to manufacturing tolerances in the encapsulation with molding material, lead to bending of the leadframe connections 11, 12 or tilting of the component during mounting.

FIG. 3 shows a perspective view of a further embodiment of a component according to the invention on a support 8, for example a circuit board. The emission takes place substantially parallel to the main surface of the support, on which the component rests with the mounting surface 6. On either side of the leadframe connections, the component is bounded by inclined surfaces 9a, 9b which are tilted relative to one another and, as so-called demolding bevels, facilitate the separation of a mold from the component body during production.

In the emission direction 7, the component is bounded by a curved surface 15 which is partly cylindrical in the case shown, the cylinder axis being oriented approximately parallel to the longitudinal axis of the leadframe. The curved surface may also be formed spherically as part of a sphere surface or aspherically. Furthermore, both a convex surface and a concave surface are possible.

As a result of this shape, a lens effect and hence focusing of the emitted radiation are achieved.

In the embodiment, the semiconductor LED 1 has an emission spectrum which is in the ultraviolet or blue spectral range. For the production of mixed-color or white light, an emission of the semiconductor LED in the ultraviolet or blue spectral range is particularly advantageous since conversion to longer wavelengths is as a rule substantially more efficient than a conversion from longer to shorter wavelengths. Since the ultraviolet or blue spectral range is at the short wave end of the optically visible range, efficient conversion to a majority of the visible wavelengths is possible from there by means of suitable conversion materials.

The semiconductor LED 1 is preferably based on GaN, InGaN, AlGaN or AlInGaN. However, it may alternatively also be based on the material system ZnS/ZnSe or on another material system suitable for this spectral range.

Figure 4:
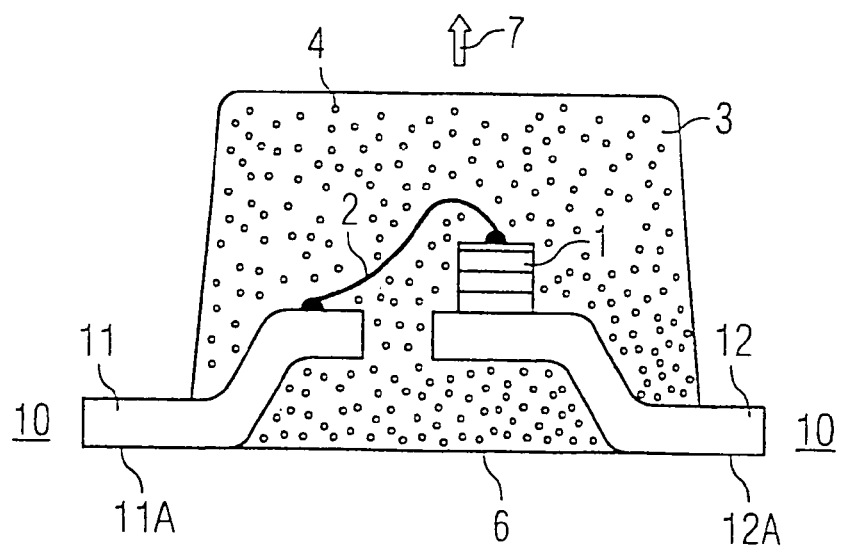
FIG. 4 is a schematic perspective view of a fourth embodiment of a component according to the invention.

In contrast to the embodiments described so far, the embodiment of a component according to the invention, shown in FIG. 4, is provided with a main emission direction 7 arranged perpendicular to the mounting plane 6. The first predetermined angle here is about 90°. The leadframe 10 has two S-shaped bends, the leadframe connections projecting laterally from the molding material 3, and the connection surfaces of the leadframe connections being in the mounting plane 13 determined by the mounting surface 6. The second predetermined angle here is thus 0°.

A radiation-emitting chip 1 in the form of a semiconductor LED is fastened, for example soldered or adhesively bonded by an electrically conductive bond, on one part of the two-part leadframe 10. A wire connection 2 is led to the other part of the leadframe. As in the other embodiments, leadframe 10 and semiconductor LED are surrounded by a radiation-permeable molding material comprising conversion material.

In an embodiment of the production method according to the invention, after mounting and contacting of the semiconductor LED 1, a transparent plastics compression molding material 3 is injection-molded onto the leadframe connections 11 and 12 in a suitable injection-molding apparatus.

Preferably, the leadframe with the semiconductor LED is surrounded with the plastics compression molding material by molding by means of an injection molding or injection compression molding process. For this purpose, a subregion of the leadframe 10 with premounted semiconductor LED 1 is introduced into an injection mold, and the plastics injection molding material 3 is liquefied and is injected into the injection mold. It is advantageous to preheat the leadframe (10) prior to the injection molding.

In a variant of this process, a multiplicity of leadframes, each having radiation-emitting chips mounted thereon, can also be encapsulated in a cohesive covering and subsequently divided into individual components, for example by breaking, sawing or a laser cutting method by means of a water jet.

Phosphor particles which consist of a phosphor by means of which at least partial wavelength conversion of the light radiation emitted by the semiconductor LED 1 is brought about are embedded as conversion material 4 in this plastics compression molding material 3. This wavelength conversion produces an emission spectrum which gives the optical impression of multi-colored light or white light.

The prefabrication of the leadframe 10 and the surrounding by injection molding with the molding material consisting of the plastics compression molding material 3, the phosphor particles 4 and optionally further fillers are effected in such a way that the leadframe sections 11 and 12 are led horizontally out of the molding material.

The finished component can be soldered to a circuit board at the connection surfaces of the leadframe connections 11 and 12, which connection surfaces are perpendicular to the mounting surface. A component suitable for SMT (surface mounting technology) is thus produced.

The preparation of the molding material formed by the plastics compression molding material 3, the phosphor particles 4 and optionally further fillers is described in more detail below.

Prereacted, storage-stable and radiation-stable transparent compression molding materials which comprise commercial epoxy-cresol novolaks with phenolic curing agents and whose total chlorine content is below 1500 ppm can be used as starting materials for the plastics compression molding material. Preferably, these compression molding materials contain an internal mold release agent or lubricant, which facilitates the removal of the cured molding material from the injection mold. The presence of such an internal mold release agent is, however, not absolutely essential. For example, the following commercially available compression molding materials from Nitto and Sumitomo may therefore be used:

Nitto NT-600 (without internal mold release agent)
Nitto NT-300H-10.000 (with internal mold release agent)
Nitto NT.300S-10.000 (with internal mold release agent)
Nitto NT 360-10.000 (with internal mold release agent)
Sumitomo EME 700L (without internal mold release agent)

These compression molding materials are supplied as standard in rod or tablet form.

The use of compression molding materials in rod or tablet form facilitates the metering and increases the accuracy thereof compared with a compression molding material present in powder form. However, a compression molding material present in the form of a powder or in another modification can of course also be used in the invention. Furthermore, a compression molding material present in the form of a powder could also first be brought into rod or tablet form for more exact metering and then be further processed.

All phosphors which are described in the above-mentioned international publications WO 97/50132 and WO 98/12757 may be present as conversion materials. In particular, an inorganic luminescent pigment powder comprising phosphors having the general formula $A_3B_5X_{12}$:M can be used. These are, for example, garnets doped with rare earths, in particular Ce.

Compounds that satisfy the formula $A'_3B'_5O_{12}$:M' have proven to be efficient phosphors (provided that they are not unstable under the customary production and operating conditions). Therein, A' is at least one element from the group consisting of Y, Lu, Sc, La, Gd, Tb and Sm; B' is at least one element from the group consisting of Al, Ga and In; and M' is at least one element from the group consisting of Ce and Pr, preferably Ce. The compounds YAG:Ce ($Y_3Al_5O_{12}$:Ce), TAG:Ce ($Tb_3Al_5O_{12}$:Ce), TbYAG:Ce (($Tb_xY_{1-x})_3Al_5O_{12}$:Ce, $0 \leq x \leq 1$), GdYAG:Ce (($Gd_xY_{1-x})_3Al_5O_{12}$:$Ce^{3+}$, $0 \leq x \leq 1$) and GdTbYAG:Ce (($Gd_xTb_yY_{1-x-y})_3Al_5O_{12}$:$Ce^{3+}$, $0 \leq x \leq 1$, $0 \leq y \leq 1$) and mixtures based thereon have proven to be particularly efficient phosphors. Al can be at least partly replaced by Ga or In. Said phosphors are to be understood by way of example and not as restricting the general formula $A_3B_5X_{12}$:M.

The compounds $SrS:Ce^{3+}$, Na, $SrS:Ce^{3+}$, Cl, $SrS:CeCl_3$, $CaS:Ce^{3+}$ and $SrSe:Ce^{3+}$ are furthermore suitable as a phosphor. Moreover, sulfide- and oxysulfide-based host lattices and aluminates, borates, alkaline earth metal sulfides, thiogallates or orthosilicates, etc. having metal centers appropriately excitable in the short-wave range or organometallic phosphor systems can also be used. Furthermore, soluble or sparingly soluble organic dyes and phosphor mixtures can be used.

Regarding the particle size of the phosphor particles, a mean particle diameter between 2 μm and 20 μm, preferably approximately between 4 μm and 10 μm, particularly preferably between 5 μm and 6 μm, is advantageous. The conversion properties can be further improved by removing the dust fraction, i.e. for example particles having a particle diameter of less than 2 μm, preferably less than 1 μm, from the phosphor powder. With decreasing particle diameter, the scatter of the radiation at the particles increases and the conversion efficiency decreases, so that it is advantageous to separate off the phosphor particles having a comparatively small particle diameter.

Thus, for example, experiments have shown that milling the phosphor, which produces a particle size $d_{50}$ of substantially less than 5 μm, results in a volume fraction of up to 30% of particles having a particle size less than 1 μm. Regardless of the difference in refractive index compared with the surrounding matrix, for example a plastics matrix, particles having a size of less than 1 μm lead to strong light scattering and thus adversely affect the transmission and the transparency of the matrix.

According to simulation calculations, the pure transmission at a wavelength of 500 nm in the case of a typical plastics matrix having a thickness of 400 μm and a phosphor concentration of 3.5% by weight with a mean phosphor particle size of 2 μm is an order of magnitude of 1,000 greater than for a particle size of 1 μm and further increases sharply with increasing particle size. For shorter wavelengths, particle sizes of 1 μm or less have a greater effect.

In particular, particles of the luminescent pigment YAG:Ce are distinguished by particular conversion efficiency. A conversion material based thereon is known by the product designation L175 from Osram of Germany. An experiment on mixing with a compression molding material was carried out with this conversion material, a compression molding material of the type Nitto NT-300 H10.000 with an internal mold release agent being used. As preparation for the experiment, the conversion material L175 was predried at 200° C. for about 8 h. Thereafter, a surface modifier having the designation diethylene glycol monomethyl ether was mixed in liquid form with the predried converter (0.1% by weight, based on weight of compression molding material). This mixture was sealed air-tight in a glass vessel and left to stand overnight. Directly before processing, the conversion material was mixed with the compression molding material of the abovementioned type. The compression molding material had been milled beforehand in a mill (for example a ball mill) in powder form. The mixing ratio was 20% by weight of conversion material/DEGME mixture and 80% by weight of Nitto NT 300H-10.000. After the coarse mixing of the mixture by stirring, the mixture was thoroughly mixed and milled again in a mill (for example a ball mill) and very fine powder was thus produced.

An injection molding experiment was then carried out with this molding material on the apparatus of the type FICO Brilliant 100. The already appropriately prefabricated leadframes 10 were preheated at 150° C. prior to the injection molding, and the following machine parameters were set for the injection molding:

mold temperature: 150° C.
injection time: 22.4 s
injection pressure: 73-82 bar (depending, inter alia, on the amount of material set)
curing time: 120 s As a result, it was possible to achieve a very homogeneous, cured molding material which was distinguished by excellent freedom from bubbles and shrink holes. In general, it was found that milling of the compression molding material to very fine powder prior to mixing gave better results with regard to freedom from bubbles and shrink holes than with the use of a coarser-particled residual material powder.

In addition, an adhesion promoter, such as 3-glycidyloxy-propyltrimethoxysilane, for example having the product designation A-187 from Hüls AG, can also be used. This adhesion promoter can be added to the phosphor in concentrations of up to 3% by weight directly after the drying process and can be mixed therewith overnight at room temperature.

According to an embodiment, the method according to the invention has been described on the basis of an SMD (surface-mounted design), but it can also be realized in the case of a so-called radial diode.

The explanation of the invention with reference to the embodiments described does not of course represent any restriction of the invention to these embodiments. In particular, individual features of the embodiments can also be combined in a form other than the form described. Likewise, production processes described are not restricted to surface-mountable components, laterally emitting components or components which contain a conversion material.

We claim:

1. A surface-mountable radiation-emitting component, comprising:
   a leadframe and a radiation-emitting chip mounted on said leadframe;
   a molding material encasing said leadframe and said radiation-emitting chip, the molding material having a shape defining a mounting surface of the component, said mounting surface extending at a first predetermined angle, said first predetermined angle having a value lying within a range from 0° to 20° relative to a main emission direction of the component, said molding material having a shape defining a curved surface in the main emission direction; and
   said leadframe having leadframe connections, wherein said leadframe connections protrude out of said molding material and have connection surfaces which enclose a second predetermined angle with said mounting surface, said second predetermined angle having a value lying within a range from 70° to 90°.

2. The component according to claim 1, wherein said leadframe connections, viewed from said mounting surface, are led laterally out of said molding material.

3. The component according to claim 1, wherein said second predetermined angle has a value of substantially 90°.

4. The component according to claim 1, wherein said leadframe connections extend up to a mounting plane defined by said mounting surface.

5. The component according to claim 1, wherein said leadframe connections extend into a vicinity of a mounting plane defined by said mounting surface.

6. The component according to claim 1, wherein said leadframe is substantially flat.

7. The component according to claim 1, wherein said leadframe is formed with voids selected from the group consisting of passages and lateral recesses within a region surrounded by said molding material.

8. The component according to claim 1, wherein said molding material has a top surface parallel to said mounting surface.

9. The component according to claim 1, wherein said molding material, viewed from said radiation-emitting chip, is formed with a curved surface in a main emission direction.

10. The component according to claim 8, wherein said curved surface is selected from the group consisting of a part-cylindrical surface, part-spherical surface and part-aspherical surface.

11. The component according to claim 1, wherein said radiation-emitting chip contains a compound selected from the group consisting of GaN, InGaN, AlGaN, InAlGaN, ZnS, ZnSe, CdZnS and CdZnSe.

12. The component according to claim 1, wherein said radiation-emitting chip is configured to emit radiation selected from the group consisting of visible light, infrared radiation, and ultraviolet electromagnetic radiation.

13. The component according to claim 1, wherein said molding material is a radiation-permeable plastics compression molding material.

14. The component according to claim 1, wherein said molding material is a resin-based material.

15. The component according to claim 1, which comprises conversion material distributed in said molding material.

16. The component according to claim 1, wherein said molding material consists essentially of a prereacted epoxy resin.

17. The component according to claim 16, wherein said epoxy resin is epoxy novolak or epoxy-cresol novolak.

18. The component according to claim 16, wherein said epoxy resin has been prereacted with at least one of a phenol curing agent and an anhydride curing agent.

19. The component according to claim 16, wherein said conversion material contains a material selected from the group consisting of an organic phosphor, an inorganic phosphor, and a mixture thereof.

20. The component according to claim 19, wherein said phosphor contains a phosphor metal center M in a host lattice based on the general formula $A_3B_5X_{12}$.

21. The component according to claim 19, wherein said phosphor contains a phosphor metal center M in a host lattice based on a sulfide, oxysulfide, borate, aluminate, or metal chelate complex.

22. The component according to claim 20, wherein said phosphor is selected from the group consisting of YAG:Ce, TAG:Ce, TbYAG:Ce, GdYAG:Ce, GdTbYAG:Ce, and mixtures thereof.

23. The component according to claim 1, wherein said molding material contains an adhesion promoter.

24. The component according to claim 23, wherein said adhesion promoter is 3-glycidyloxypropyltrimethoxysilane or further derivatives based on trialkoxysilane.

25. The component according to claim 15, wherein said molding material contains a surface modifier for modifying a surface of said conversion material.

26. The component according to claim 25, wherein said surface modifier is diethylene glycol monomethyl ether.

27. The component according to claim 1, wherein said molding material contains a mold release agent or a lubricant.

28. The component according to claim 27, wherein said mold release agent is a wax-based mold release agent or a metal soap with long-chain carboxylic acids.

29. The component according to claim 27, wherein said mold release agent is a stearate.

30. The component according to claim 1, wherein said molding material contains inorganic fillers for increasing a refractive index of said molding material.

31. The component according to claim 30, wherein said inorganic fillers are selected from the group consisting of $TiO_2$, $ZrO_2$, $\alpha$-$Al_2O_3$, and other metal oxides.

32. The component according to claim 1, wherein said molding material contains glass particles.

33. The component according to claim 32, wherein said glass particles have a mean particle size of less than 100 μm.

34. The component according to claim 32, wherein said glass particles have a mean particle size of less than 50 μm.

35. The component according to claim 32, wherein a proportion of said glass particles in said molding material is between 0% by weight and 90% by weight.

36. The component according to claim 32, wherein a proportion of said glass particles in said molding material is between 10% by weight and 50% by weight.

37. The component according to claim 1, wherein said molding material is a mixture containing the following constituents:
 plastics compression molding material $\geq$60%;
 conversion material $\geq$0% and $\leq$40%;
 adhesion promoter $\geq$0% and $\leq$3%;
 mold release agent $\geq$0% and $\leq$2%;
 surface modifier $\geq$0% and $\leq$5%;
 antioxidant $\geq$0% and $\leq$5%;
 UV light stabilizer $\geq$0% and $\leq$2%; and
 glass particles $\geq$0% and $\leq$90%.

38. The component according to claim 37, wherein said conversion material is present in an amount of >10% and $\leq$25% and said antioxidant is based on phosphite or on sterically hindered phenols.

39. The component according to claim 15 configured to produce radiation selected from the group consisting of mixed-color light, white light, infrared, and ultraviolet electromagnetic radiation.

40. A method of producing the component according to claim 1, which comprises the following steps:
 preparing a molding material from a resin powder prereacted with curing agent, and optionally further fillers; and
 encasing the leadframe and the radiation-emitting chip mounted thereon with the molding material to form the component according to claim 1.

41. The component according to claim 1 wherein the shape of the molding material further defines side surfaces that are substantially perpendicular to the mounting surface, and wherein the leadframe connections protrude out of the side surfaces.

* * * * *

UNITED STATES PATENT AND TRADEMARK OFFICE
CERTIFICATE OF CORRECTION

PATENT NO. : 7,436,002 B2  
APPLICATION NO. : 10/747703  
DATED : October 14, 2008  
INVENTOR(S) : Herbert Brunner et al.

It is certified that error appears in the above-identified patent and that said Letters Patent is hereby corrected as shown below:

In Claim 37, at column 14, line 4, before "plastics" insert --a)--.

In Claim 37, at column 14, line 5, before "conversion" insert --b)--.

In Claim 37, at column 14, line 6, before "adhesion" insert --c)--.

In Claim 37, at column 14, line 7, before "mold" insert --d)--.

In Claim 37, at column 14, line 8, before "surface" insert --e)--.

In Claim 37, at column 14, line 9, before "antioxidant" insert --f)--.

In Claim 37, at column 14, line 10, before "UV" insert --g)--.

In Claim 37, at column 14, line 11, before "glass" insert --h)--.

Signed and Sealed this

Sixth Day of January, 2009

JON W. DUDAS  
*Director of the United States Patent and Trademark Office*